United States Patent [19]

Hakozaki

[11] Patent Number: 6,091,637
[45] Date of Patent: Jul. 18, 2000

[54] METHOD FOR WRITING DATA INTO NON-VOLATILE SEMICONDUCTOR MEMORY CELL

[75] Inventor: Kenji Hakozaki, Fukuyama, Japan

[73] Assignee: Sharp Kabushiki Kaisha, Osaka, Japan

[21] Appl. No.: 09/144,317

[22] Filed: Aug. 31, 1998

[30] Foreign Application Priority Data

Sep. 25, 1997 [JP] Japan ..................................... 9-259722

[51] Int. Cl.⁷ ...................................................... G11C 7/02
[52] U.S. Cl. ................................ 365/185.22; 365/185.29; 365/185.28; 365/185.03; 365/185.01; 365/185.24
[58] Field of Search .......................... 365/189.01, 230.01, 365/185.22, 185.24, 185.03, 185.01

[56] References Cited

U.S. PATENT DOCUMENTS

| 5,218,569 | 6/1993 | Banks .................................. | 365/189.01 |
| 5,602,789 | 2/1997 | Endoh et al. ........................... | 365/201 |
| 5,757,699 | 5/1998 | Takeshima et al. ..................... | 365/185.24 |
| 5,768,191 | 6/1998 | Choi et al. ............................. | 365/185.22 |
| 5,790,453 | 8/1998 | Chevallier ............................. | 365/185.03 |
| 5,812,451 | 9/1998 | Iwata ................................... | 365/185.11 |
| 5,909,449 | 6/1999 | So et al. ............................... | 371/21.4 |
| 5,920,507 | 7/1999 | Takenchi et al. ...................... | 365/185.22 |

OTHER PUBLICATIONS

Lai, Stephan., "Large Capacity Flash Memories for which Multivated and Three Dimensional Cells are Essential", (Feb. 1997) *Nikkei Microdevices* 62–71 (Translation Included).

*Primary Examiner*—Viet Q. Nguyen
*Attorney, Agent, or Firm*—Morrison & Foerster, LLP

[57] ABSTRACT

A method including: a first writing step for writing data by injecting electrons into the floating gate; a first verifying step for verifying whether the threshold voltage is higher than the first reference level after performing the first writing operation; a step of repeating the first writing step and the first verifying step until the threshold voltage becomes higher than the first reference level, if the threshold voltage is lower than the first reference level; a second verifying step for verifying whether the threshold voltage is higher than a second reference level which is set to be higher than the first reference level, if the threshold voltage is higher than the first reference level; a step of ending the writing operation if the threshold voltage is lower than the second reference level; and a second writing step for writing data by discharging electrons from the floating gate until the threshold voltage becomes higher than the first reference level and lower than the second reference level, if the threshold voltage is higher than the second reference level.

3 Claims, 6 Drawing Sheets

METHOD FOR WRITING DATA INTO NON-VOLATILE SEMICONDUCTOR MEMORY CELL

CROSS-REFERENCES TO RELATED APPLICATIONS

This application is related to Japanese patent application No. HEI 09-259722 filed on Sep. 25, 1997 whose priority is claimed under 35 USC §119, the disclosure of which is incorporated herein by reference in its entirety.

BACKGROUND OF THE INVENTION

1. Field of the Invention

The present invention relates to a method for writing data into a non-volatile semiconductor memory cell, and more particularly to a method for writing data into a non-volatile semiconductor memory cell having a floating gate and a control gate and being electrically writable and erasable.

2. Description of the Related Art

As a non-volatile semiconductor memory, a flash memory is known in which data are written or erased by raising or lowering a threshold voltage (Vth) by injecting/discharging electrons into/from a floating gate which is electrically floating. As a method for writing or erasing data in a flash memory cell, a method is generally known in which data are written by injecting channel hot electrons (CHE) into the floating gate, and a lump erasure is carried out block by block or sector by sector by discharging electrons from the floating gate using a Fowler Nordheim (FN) tunnel current.

The operation of writing data is carried out, for example, by applying a voltage of 5V to a drain, 0V to a source, and 10V to a control gate to inject CHE generated near the drain into the floating gate so as to raise the threshold voltage.

Next, a verifying operation is carried out on the memory cell into which data have been written according to the above-described method. Here, if the threshold voltage (Vth) of the memory cell in a written state is to satisfy 5.5V<Vth, the verifying operation after the writing operation is carried out by comparing the threshold voltage of the memory cell with a reference level 5.5V. If it is found, as a result of verification, that the threshold voltage of the memory cell is higher than the reference level, the writing operation is ended. If the threshold voltage is lower than the reference level, the writing operation is performed again.

FIG. 5 is a flowchart showing a writing operation according to a prior art. By repeating these writing and verifying operations, the threshold voltage of every memory cell can be made higher than 5.5V.

The erasing operation is carried out, for example, by applying a voltage of −10V to the control gate, 5V to the source, and letting the drain open to generate an FN tunnel current from the floating gate to the source for discharging electrons so as to lower the threshold voltage. Here, the erasing operation is carried out on a plurality of cells, for example, block by block or sector by sector.

The operation of reading the data is carried out, for example, by applying a voltage of 5V to the control gate, 1V to the drain, and 0V to the source if the threshold voltage after the writing operation is 5.5V or more and the threshold voltage after the erasing operation is 4.5V or less. Here, since the memory cell in an erased state will be in a conductive state and the memory cell in a written state will be in a non-conductive state by the above operation, the states represented by two values "0" and "1" can be differentiated.

As shown above, the operation of the memory cell having two values has been explained. However, for future flash memories, a research is now being made on a multi-valued cell technique allowing one memory cell to have data of plural bits.

For example, as described on pages 62 to 71 of "Large Capacity Flash Memories for which multi-valued and three-dimensional cells are essential", NIKKEI MICRODEVICES, February 1997, a plurality of data can be stored in one memory cell (a multi-valued cell) in a flash memory using a multi-valued cell technique, so that a large storage capacity can be obtained without increasing the chip area.

Hereafter, an operation of writing data into a multi-valued cell will be explained.

Here, explanation of a technique on multi-valued cells having four values (2 bits/cell) will be given as an example. FIG. 4 is a view for explaining the writing operation in a multi-valued cell. As shown in FIG. 4, the data after the writing operation are divided into four threshold voltage (Vth) ranges.

The memory cell is constructed in such a manner that the threshold voltages in the four ranges can be differentiated by setting, for example, the data "11" to be within a range of 0.5V<Vth<3.0V, the data "10" to be within a range of 3.5V<Vth<4.0V, the data "01" to be within a range of 4.5V<Vth<5.0V, and the data "00" to be within a range of 5.5V<Vth. Thus, the data represented by the four values (11, 10, 01, 00) can be written into the memory cell.

The four-valued data can be written by repeating the writing operation and the verifying operation in the same manner as in the operation of writing two-valued data. For example, the writing operation is carried out using CHE by grounding the source and applying a voltage of 10V to the control gate and 5V to the drain, as shown in FIG. 6 which illustrates the method for writing the data "10". Next, a verifying operation is carried out on the memory cell into which the data have been written by the above-described method. In the case of data "10", the verifying operation is carried out by setting the reference level to be 3.5V and comparing the threshold voltage Vth of the memory cell with the reference level. The threshold voltage Vth of the memory cell can be made higher than 3.5V by repeating these writing and verifying operations.

However, according to the multi-valued cell described in the prior art, the ranges of threshold voltages after the writing operation will be narrow as compared with a two-valued cell. As described before, the threshold voltage Vth must be set within a range having a width of 0.5 V or less in the case of data "10" and "01". The writing speed in memory cells vary to some extent because of the process variations of the memory cells or the like, so that the threshold voltages after the writing operation are distributed in a somewhat wide range.

Lines A, B, and C in FIG. 6 illustrate writing operations in three cells having different writing speeds. In the case of line A in FIG. 6, since the threshold voltage is already higher than an upper limit of the threshold voltage, there will be a problem that correct data cannot be read out. A conventional method employed adjustment of writing pulses or writing voltages so that the threshold voltage of the memory cell will not be higher than its upper limit. In order to perform plural small cycles of writing and verifying operations, the control of the writing operations is complicated as compared with two-valued memory cells. Also, if an attempt is made to allow the memory cell to store data of more than four values, the ranges of the threshold voltages will be narrower and the writing operation will be more complicated, rendering it difficult to realize multi-valued cells. Further, even by these writing methods, a cell in which the threshold voltage exceeds its upper limit as shown by line A in FIG. 6 may unexpectedly appear. In such a case, if a redundancy relief of the memory cell is not available, a writing error occurs, leading to output of incorrect data.

SUMMARY OF THE INVENTION

The present invention has been made in view of these circumstances and the purpose thereof is to provide a method for writing data into a non-volatile semiconductor memory cell by which the threshold voltage of the memory cell after the writing operation comes within a predetermined range with certainty in writing multi-valued data into the memory cell.

Accordingly, the present invention provides a method for writing data into a non-volatile semiconductor memory cell including a source, a drain, a floating gate, and a control gate, in which the memory cell has been erased beforehand by discharging electrons from the floating gate so that a threshold voltage of the memory cell is lower than a predetermined first reference level, the method comprising: a first writing step for writing data into the memory cell by injecting electrons into the floating gate; a first verifying step for verifying whether the threshold voltage of the memory cell is higher than the first reference level after performing the first writing operation; a step of repeating the first writing step and the first verifying step until the threshold voltage becomes higher than the first reference level, if it is found by the first verifying step that the threshold voltage is lower than the first reference level; a second verifying step for verifying whether the threshold voltage of the memory cell is higher than a second reference level which is set to be higher than the first reference level, if it is found that the threshold voltage is higher than the first reference level; a step of ending the writing operation if it is found by the second verifying step that the threshold voltage is lower than the second reference level; and a second writing step for writing data into the memory cell by discharging electrons from the floating gate until the threshold voltage becomes higher than the first reference level and lower than the second reference level, if it is found that the threshold voltage is higher than the second reference level.

BRIEF DESCRIPTION OF THE DRAWINGS

The present invention will be better understood from the following detailed description of preferred embodiments of the invention, taken in conjunction with the accompanying drawings, in which.

DETAILED DESCRIPTION OF THE PREFERRED EMBODIMENTS

Figure 1:
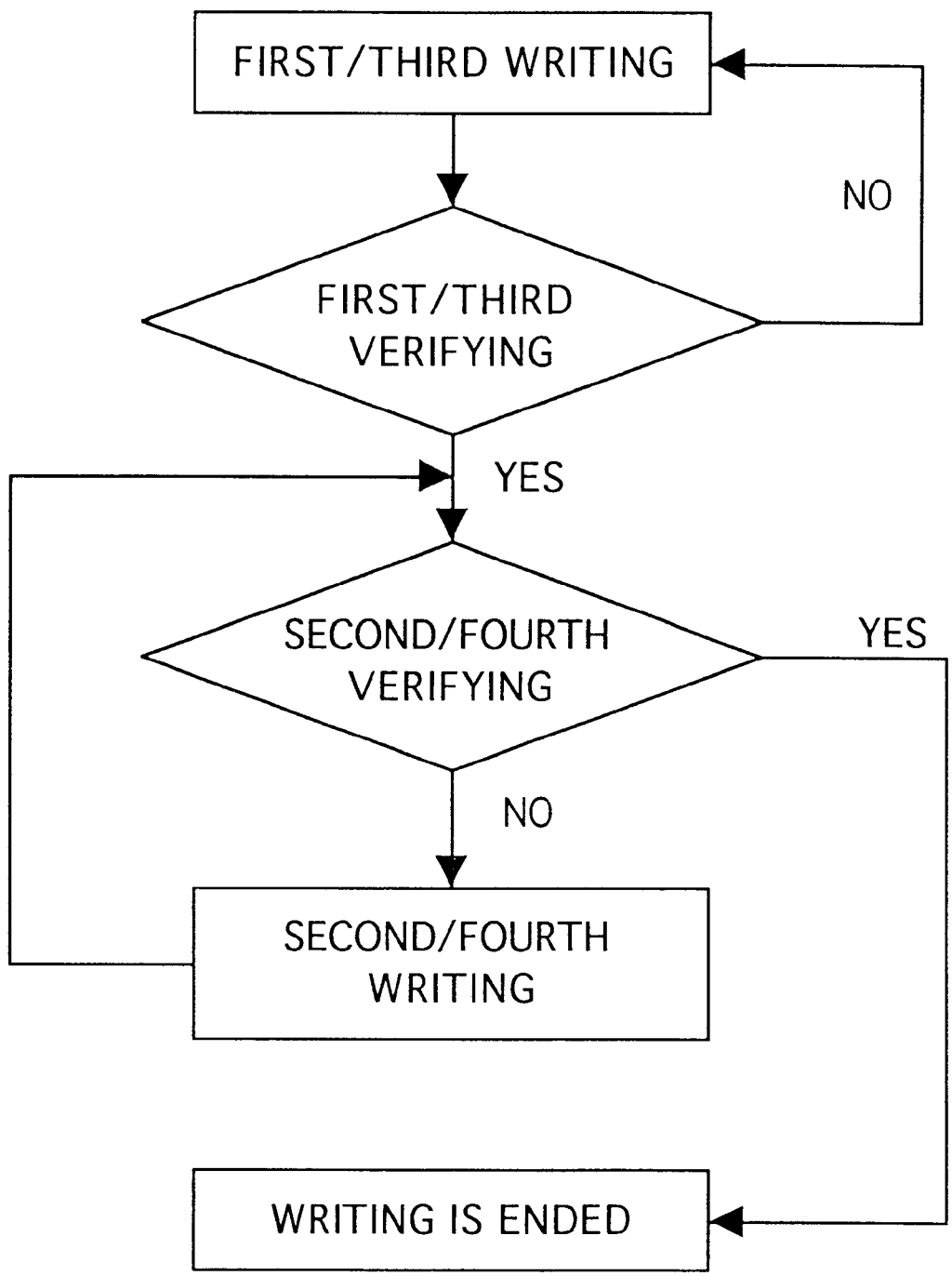
FIG. 1 is a flowchart for showing steps in a writing operation according to the present invention.

According to one aspect, the present invention provides a method for writing data into a non-volatile semiconductor memory cell including a source, a drain, a floating gate, and a control gate, in which the memory cell has been erased beforehand by discharging electrons from the floating gate so that a threshold voltage of the memory cell is lower than a predetermined first reference level. The method comprises: a first writing step for writing data into the memory cell by injecting electrons into the floating gate; a first verifying step for verifying whether the threshold voltage of the memory cell is higher than the first reference level after performing the first writing operation; a step of repeating the first writing step and the first verifying step until the threshold voltage becomes higher than the first reference level, if it is found by the first verifying step that the threshold voltage is lower than the first reference level; a second verifying step for verifying whether the threshold voltage of the memory cell is higher than a second reference level which is set to be higher than the first reference level, if it is found that the threshold voltage is higher than the first reference level; a step of ending the writing operation if it is found by the second verifying step that the threshold voltage is lower than the second reference level; and a second writing step for writing data into the memory cell by discharging electrons from the floating gate until the threshold voltage becomes higher than the first reference level and lower than the second reference level, if it is found that the threshold voltage is higher than the second reference level.

According to the above construction, in the memory cell which has been erased beforehand by discharging electrons from the floating gate, the threshold voltage of the memory cell after performing the writing operation can be set within a range defined by two predetermined reference levels with certainty.

Therefore, even in the case of a multi-valued cell with a very narrow threshold voltage range, multi-valued data can be written without generating a writing error.

The first writing step for writing data into the memory cell may be performed by grounding the source and applying a positive voltage to the drain and a positive voltage to the control gate to inject generated channel hot electrons into the floating gate.

The second writing step for writing data into the memory cell maybe performed by applying a positive voltage to one of the drain and the source, letting the other of the drain and the source open, and applying a negative voltage to the control gate to discharge electrons from the floating gate to the source or to the drain using a generated Fowler Nordheim tunnel current.

According to the above construction, in the memory cell which has been erased beforehand by discharging electrons from the floating gate, the threshold voltage can be set within the range defined by the two predetermined reference levels with certainty by performing the second writing operation even if the threshold voltage of a memory cell unexpectedly exceeds its upper limit by the first writing operation.

Preferably, three or more pairs of the first and second reference levels are set beforehand to write any one of three or more values by selecting one of the three or more pairs of the first and second reference levels and repeating the first writing step, the first verifying step, the second writing step, and the second verifying step.

According to the above construction, multi-valued data represented by three or more values can be written into the memory cell by setting the threshold voltage to be within a range defined by any one of the three or more pairs of the reference levels which have been set beforehand.

According to another aspect, the present invention provides a method for writing data into a non-volatile semiconductor memory cell including a source, a drain, a floating gate, and a control gate, in which the memory cell has been erased beforehand by injecting electrons into the floating gate so that a threshold voltage of the memory cell is higher than a predetermined third reference level. The method comprises: a third writing step for writing data into the memory cell by discharging electrons from the floating gate; a third verifying step for verifying whether the threshold voltage of the memory cell is lower than the third reference level after performing the third writing operation; a step of repeating the third writing step and the third verifying step until the threshold voltage becomes lower than the third reference level, if it is found by the third verifying step that the threshold voltage is higher than the third reference level; a fourth verifying step for verifying whether the threshold voltage of the memory cell is lower than a fourth reference level which is set to be lower than the third reference level, if it is found that the threshold voltage is lower than the third reference level; a step of ending the writing operation if it is found by the fourth verifying step that the threshold voltage is higher than the fourth reference level; and a fourth writing step for writing data into the memory cell by injecting electrons into the floating gate until the threshold voltage becomes lower than the third reference level and higher than the fourth reference level, if it is found that the threshold voltage is lower than he fourth reference level.

According to the above construction, in the memory cell which has been erased beforehand by injecting electrons into the floating gate, the threshold voltage of the memory cell after performing the writing operation can be set within a range defined by two predetermined reference levels with certainty.

Therefore, even in the case of a multi-valued cell with a very narrow threshold voltage range, multi-valued data can be written without generating a writing error.

The third writing step for writing data into the memory cell may be performed by applying a positive voltage to one of the drain and the source, letting the other of the drain and the source open, and applying a negative voltage to the control gate to discharge electrons from the floating gate to the source or to the drain using a generated Fowler Nordheim tunnel current.

The fourth writing step for writing data into the memory cell may be performed by grounding the source and applying a positive voltage to the drain and a positive voltage to the control gate to inject generated channel hot electrons into the floating gate.

According to the above construction, in the memory cell which has been erased beforehand by injecting electrons into the floating gate, the threshold voltage can be set within the range defined by the two predetermined reference levels with certainty by performing the fourth writing operation even if the threshold voltage of a memory cell unexpectedly falls below its lower limit by the third writing operation.

Preferably, three or more pairs of the third and fourth reference levels are set beforehand to write any one of three or more values by selecting one of the three or more pairs of the third and fourth reference levels and repeating the third writing step, the third verifying step, the fourth writing step, and the fourth verifying step.

According to the above construction, multi-valued data represented by three or more values can be written into the memory cell by setting the threshold voltage to be within a range defined by any one of the three or more pairs of the reference levels which have been set beforehand.

Embodiments

The present invention will now be detailed by way of embodiments with reference to the attached drawings. However, the present invention is not limited by these embodiments and the drawings.

Figure 2:
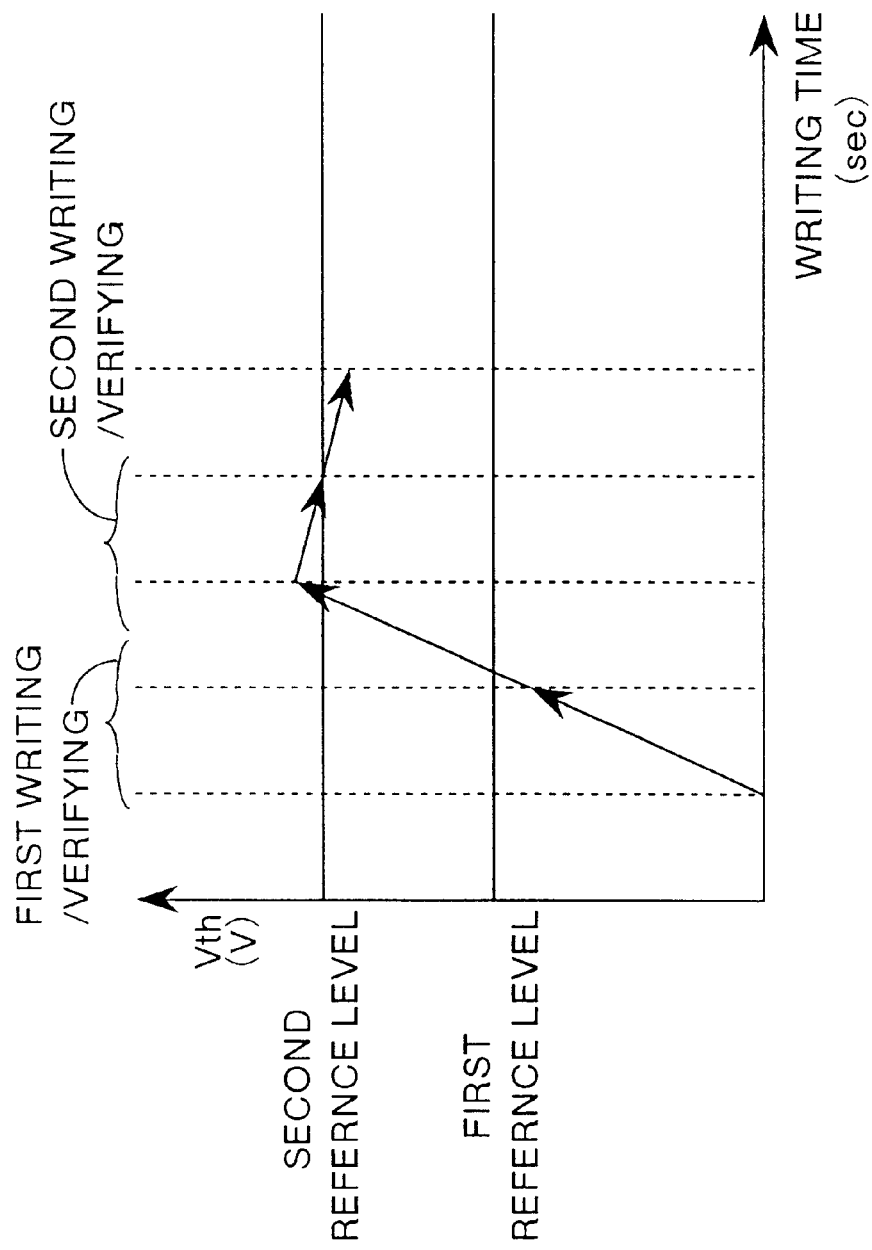
FIG. 2 is a view showing a writing operation as a first embodiment of the present invention.
Figure 3:
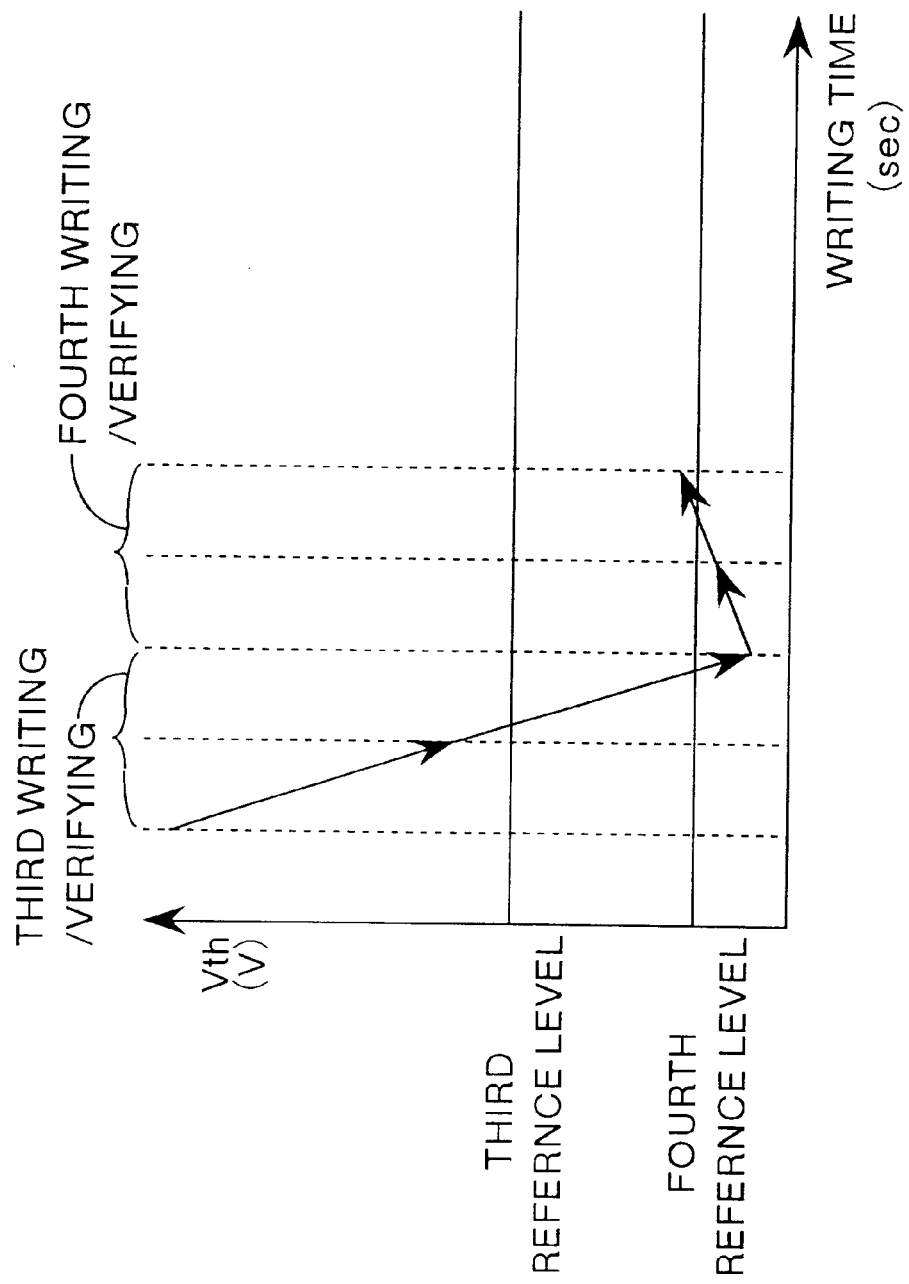
FIG. 3 is a view showing a writing operation as a second embodiment of the present invention.
Figure 4:
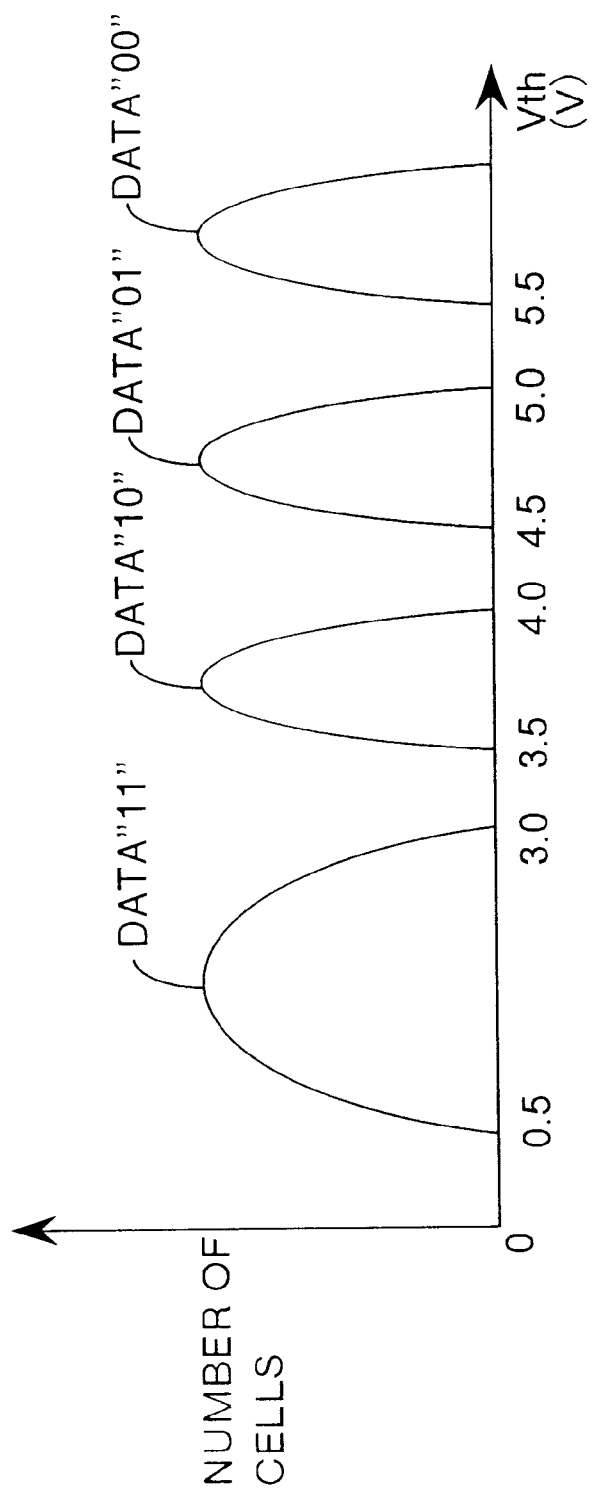
FIG. 4 is a view for explaining a multi-valued cell technique.
Figure 5:
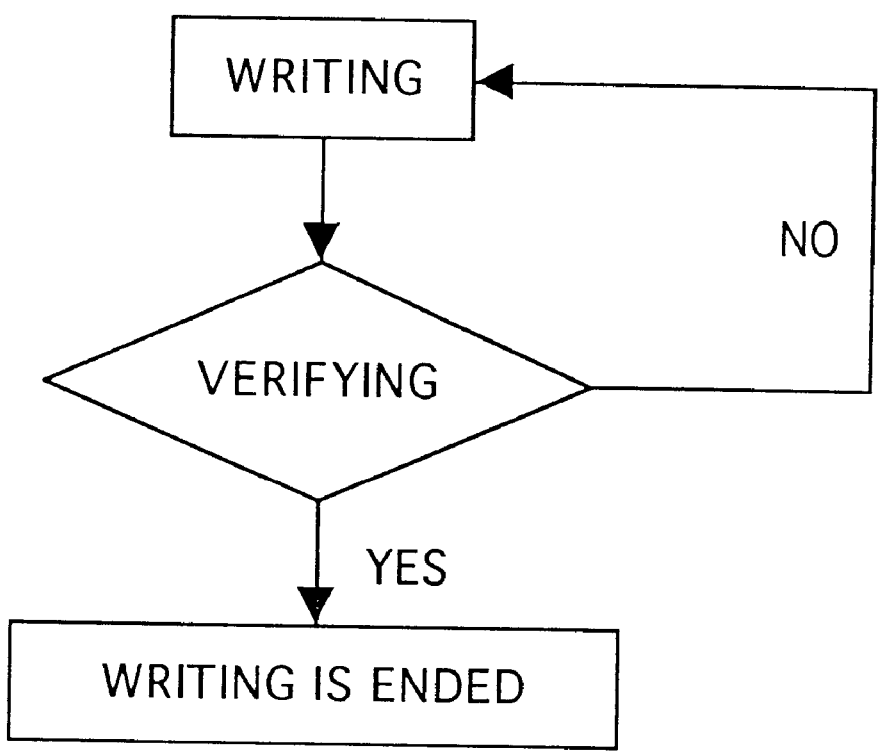
FIG. 5 is a flowchart for showing steps in a writing operation according to a prior art.
Figure 6:
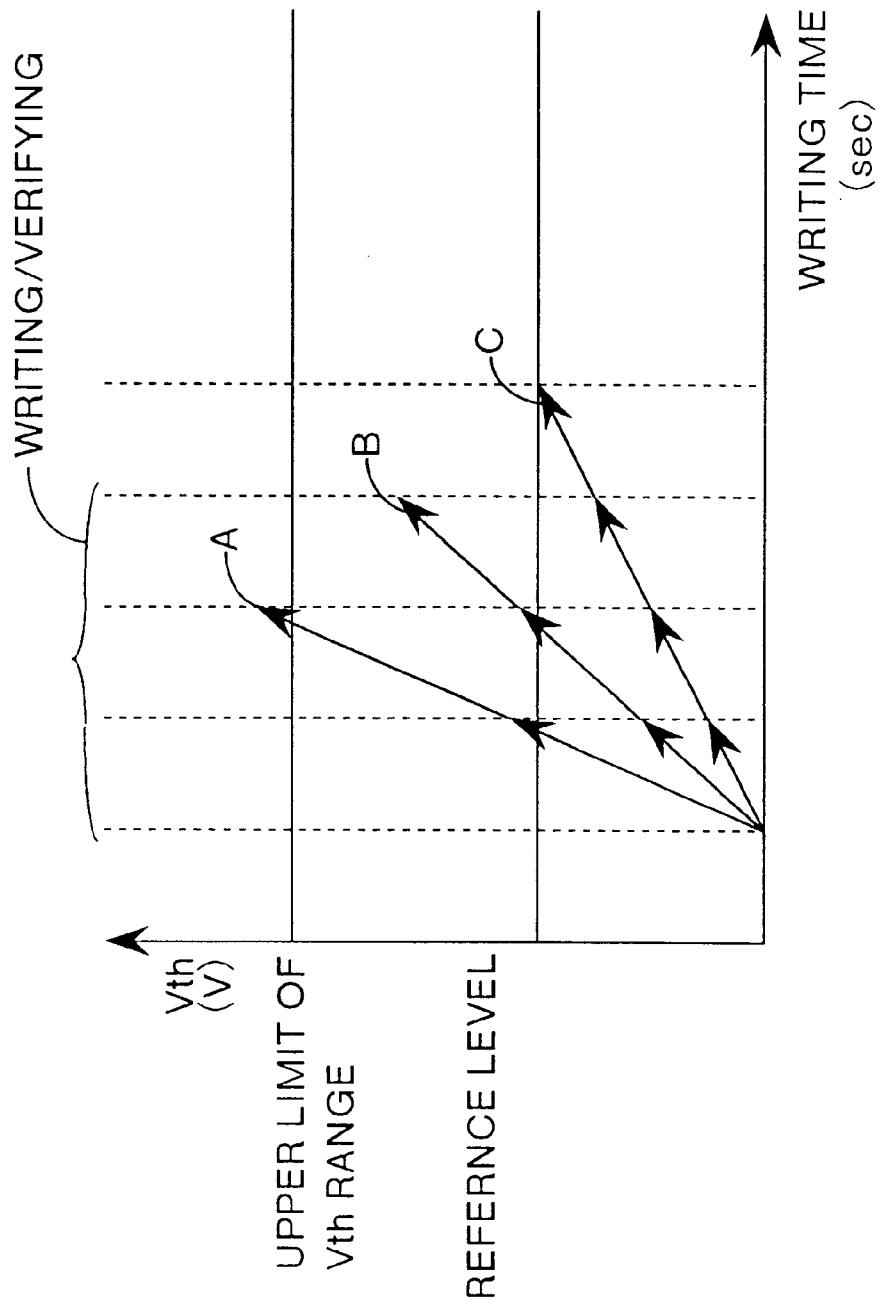
FIG. 6 is a view showing a writing operation according to the prior art.

FIG. 1 is a flowchart for showing steps in a writing operation according to the present invention. FIG. 2 is a view showing a writing operation as a first embodiment of the present invention. FIG. 3 is a view showing a writing operation as a second embodiment of the present invention.

As the first embodiment of the present invention, a flash memory into which data are written by CHE injection is now explained. Here, as an example, the threshold voltage (Vth) range of certain data is set to be 3.5V<Vth<4.0V, so that the first reference level is set to be 3.5V and the second reference level is set to be 4.0V.

First, before writing data, data are erased by applying a voltage of 5V to a source, −10V to a control gate, and letting a drain open. Thereafter, a first writing operation is carried out to raise a threshold voltage by injecting channel hot electrons into the floating gate by applying a voltage of 10V to the control gate, 5V to the drain, and 0V to the source for $1\mu$ to $10\mu$ seconds.

Then, after the first writing operation is carried out, a first verifying operation is carried out by comparing the threshold voltage of the memory cell with the first reference level which is 3.5V in this embodiment. If it is found by the first verifying operation that the threshold voltage of the memory cell is lower than 3.5V, the first writing operation is carried out again. Thereafter, the first writing operation and the first verifying operation as described above are repeated until the threshold voltage of the memory cell becomes higher than the first reference level.

Next, when the threshold voltage of the memory cell has become higher than the first reference level, a second verifying operation is carried out by comparing the threshold voltage of the memory cell with the second reference level which is 4.0V in this embodiment.

Then, if it is found by the second verifying operation that the threshold voltage of the memory cell is higher than 4.0V, a second writing operation is carried out by discharging electrons from the floating gate to the drain using an FN tunnel current by letting the source open, applying a voltage of 5V to the drain, and −10V to the control gate for 1 m to 10 m seconds. Thereafter, the second writing operation and the second verifying operation are repeated until the threshold voltage of the memory cell becomes lower than 4.0V.

FIG. 2 shows the writing operation as explained above according to the present invention. In the case of FIG. 2, the first writing operation is carried out first and, since it is found by the first verifying operation that the threshold voltage of the memory cell has not reached the first reference level yet, the first writing operation is carried out again. When the first writing operation of the second time is finished, it is found that the threshold voltage of the memory cell is higher than the first reference level, so that the first verifying operation is ended.

Next, the second verifying operation is carried out by comparing the threshold voltage of the memory cell with the second reference level. Since it is found by the second verifying operation that the threshold voltage of the memory cell is higher than the second reference level, the second writing operation is carried out, and then the second verifying operation is carried out again. Since it is found by the second verifying operation of the second time that the threshold voltage of the memory cell is still higher than the second reference level, the second writing operation is carried out again and, thereafter, the second verifying operation is carried out again. Since it is found by the second verifying operation of the third time that the threshold voltage of the memory cell is lower than the second reference level, the data writing operation is now ended. By adjusting the period of time for voltage application, the threshold voltage of the memory cell is adjusted to fall between the first reference level and the second reference level in the end.

By performing the above operations, it is possible to allow the threshold voltage of the memory cell after the data writing operation to be higher than the first reference level and lower than the second reference level with certainty. Here, in the present invention, means for performing the second writing operation is not limited to the one shown in the above embodiment.

As the second embodiment of the present invention, a flash memory into which data are written by FN tunnel current injection is now explained.

Here, as an example, the threshold voltage (Vth) range of certain data is set to be 3.5V<Vth<4.0V, so that the third reference level is set to be 4.0V and the fourth reference level is set to be 3.5V.

First, before writing data, data are erased by applying a voltage of 5V to a substrate and a source, 10V to a control gate, and letting a drain open. Thereafter, a third writing operation is carried out to lower a threshold voltage by discharging electrons from the floating gate using the FN tunnel current by letting the source open, applying a voltage of −10V to the control gate and SV to the drain for $10\mu$ to $100\mu$ seconds.

Then, after the third writing operation is carried out, a third verifying operation is carried out by comparing the threshold voltage of the memory cell with the third reference level which is 4.0V in this embodiment. If it is found by the third verifying operation that the threshold voltage of the memory cell is higher than 4.0V, the third writing operation is carried out again. Thereafter, the third writing operation and the third verifying operation as described before are repeated until the threshold voltage of the memory cell becomes lower than the third reference level.

Next, when the threshold voltage of the memory cell has become lower than the third reference level, a fourth verifying operation is carried out by comparing the threshold voltage of the memory cell with the fourth reference level which is 3.5V in this embodiment.

Then, if it is found by the fourth verifying operation that the threshold voltage of the memory cell is lower than 3.5V, a fourth writing operation is carried out by injecting channel hot electrons into the floating gate by grounding the source, applying a voltage of 5V to the drain, and 10V to the control gate for $0.1\mu$ to $1\mu$ second. Thereafter, the fourth writing operation and the fourth verifying operation are repeated until the threshold voltage of the memory cell becomes higher than 3.5V.

FIG. 3 shows the writing operation as explained above according to the present invention. In the case of FIG. 3, the third writing operation is carried out first and, since it is found by the third verifying operation that the threshold voltage of the memory cell has not become lower than the third reference level yet, the third writing operation is carried out again. When the third writing operation of the second time is finished, it is found that the threshold voltage of the memory cell is lower than the third reference level, so that the third verifying operation is ended.

Next, the fourth verifying operation is carried out by comparing the threshold voltage of the memory cell with the fourth reference level. Since it is found by the fourth verifying operation that the threshold voltage of the memory cell is lower than the fourth reference level, the fourth writing operation is carried out, and then the fourth verifying operation is carried out again. Since it is found by the fourth verifying operation of the second time that the threshold voltage of the memory cell is still lower than the fourth reference level, the fourth writing operation is carried out again and, thereafter, the fourth verifying operation is carried out again. Since it is found by the fourth verifying operation of the third time that the threshold voltage of the memory cell is higher than the fourth reference level, the data writing operation is now ended. By adjusting the period of time for voltage application, the threshold voltage of the memory cell is adjusted to fall between the third reference level and the fourth reference level in the end.

By performing the above operations, it is possible to allow the threshold voltage of the memory cell after the data writing operation to be lower than the third reference level and higher than the fourth reference level with certainty. Here, in the present invention, means for performing the fourth writing operation is not limited to the one shown in the above embodiment.

Also, the period of time for voltage application in the above-described embodiments may vary in accordance with the magnitude of the voltage, the thickness of the tunnel oxide film, the gate coupling ratio, and the like, so that it is not limited to the one shown in these embodiments. Further, if any one of the first to fourth writing operations is to be repeated, the period of time for voltage application maybe the same or may vary.

As detailed above, according to the present invention, the threshold voltage of the memory cell after the data writing operation can be set within a predetermined range with certainty by comparing the threshold voltage of the memory cell with two reference levels after the performing the writing operations. Therefore, even in the case of a multi-valued cell having very narrow threshold voltage ranges after the data writing operation, the data writing operation can be carried out without generating a writing error. Also, even if the threshold voltage of a memory cell unexpectedly exceeds its upper limit or falls below its lower limit by the first or third writing operation, the threshold voltage of the memory cell can be set within the predetermined threshold voltage range by carrying out the second or fourth writing operation.

Accordingly, a data writing operation can be carried out with certainty into a flash memory cell for storing data represented by three or more values, so that a larger capacity will be available without increasing the chip area, thereby reducing the chip cost.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

What we claim is:

1. A method for writing data into a non-volatile semiconductor memory cell including a source, a drain, a floating gate, and a control gate, in which the memory cell has been erased beforehand by discharging electrons from the floating gate so that a threshold voltage of the memory cell is lower than a predetermined first reference level, the method comprising:

a first writing step for writing data into the memory cell by injecting electrons into the floating gate;

a first verifying step for verifying whether the threshold voltage of the memory cell is higher than the first reference level after performing the first writing operation;

a step of repeating the first writing step and first verifying step until the threshold voltage becomes higher than the first reference level, if it is found by the first verifying step that the threshold voltage is lower than the first reference level;

a second verifying step for verifying whether the threshold voltage of the memory cell is higher than a second reference level which is set to be higher than a second reference level, if it is found that the threshold voltage is higher than the first reference level;

a step of ending the writing operation if it is found by the second verifying step that the threshold voltage is lower than the second reference level; and a second writing step for writing data into the memory cell by discharging electrons from the floating gate until the threshold voltage becomes higher than the first reference level and lower than the second reference level, if it is found that the threshold voltage is higher than the second reference level;

wherein the second writing step for writing data into the memory cell is performed by applying a positive voltage to one of the drain and the source, letting the other of the drain and the source open, and applying a negative voltage to the control gate to discharge electrons from the floating gate for erasure.

2. A method according to claim 1, wherein the first writing step for writing data into the memory cell is performed by grounding the source and applying a positive voltage to the drain and a positive voltage to the control gate to inject generated channel hot electrons into the floating gate.

3. A method according to claim 1, wherein three or more pairs of the first and second reference levels are set beforehand to write any one of three or more values by selecting one of the three or more pairs of the first and second reference levels and repeating the first writing step, the first verifying step, the second writing step, and the second verifying step.

* * * * *